(12) United States Patent
Liu

(10) Patent No.: US 7,750,621 B1
(45) Date of Patent: Jul. 6, 2010

(54) CLAMP METER FOR MEASURING CONSUMPTION OF CURRENT AND POWER OF ELECTRICAL PRODUCT

(75) Inventor: Shaw-Lin Liu, Taipei (TW)

(73) Assignee: Chung Instrument Electronics Industrial Co., Ltd., Taipei (TW)

( * ) Notice: Subject to any disclaimer, the term of this patent is extended or adjusted under 35 U.S.C. 154(b) by 0 days.

(21) Appl. No.: 12/504,688

(22) Filed: Jul. 17, 2009

(51) Int. Cl.
*G01R 1/20* (2006.01)
*G01R 1/04* (2006.01)
*G01R 19/00* (2006.01)

(52) U.S. Cl. .................... 324/126; 324/127; 324/133; 324/156; 439/858; 439/822

(58) Field of Classification Search ......... 324/126–127, 324/142, 133, 156; 439/822, 858
See application file for complete search history.

(56) References Cited

U.S. PATENT DOCUMENTS

| | | | | |
|---|---|---|---|---|
| 5,349,289 A | * | 9/1994 | Shirai | 324/127 |
| 5,610,512 A | * | 3/1997 | Selcuk | 324/127 |
| 6,091,237 A | * | 7/2000 | Chen | 324/142 |
| 6,311,105 B1 | * | 10/2001 | Budike, Jr. | 700/291 |
| 6,975,104 B2 | * | 12/2005 | Gregorec, Jr. | 324/126 |

* cited by examiner

*Primary Examiner*—Ha Tran T Nguyen
*Assistant Examiner*—Emily Y Chan
(74) *Attorney, Agent, or Firm*—Leong C. Lei

(57) ABSTRACT

A clamp meter is provided for measuring consumption of current and power of an electrical appliance. The clamp meter includes a power inlet port and a power outlet port that are in controlled connection with each other. A current detection element is arranged between the power inlet port and the power outlet port. When the power inlet port is connected to a power source and the power outlet port is connected to an electrical appliance to be detected, with the electrical appliance turned on, the current detection element detects and converts the current flowing through the power outlet port into a digital signal, which is displayed on a display device mounted on the clamp meter, whereby, through the data and information displayed on the display device, a user may get aware of the power consumption of the electrical appliance and abnormality of power consumption thereof.

2 Claims, 6 Drawing Sheets

CLAMP METER FOR MEASURING CONSUMPTION OF CURRENT AND POWER OF ELECTRICAL PRODUCT

(a) TECHNICAL FIELD OF THE INVENTION

The present invention generally relates to a clamp meter for measuring consumption of current and power of an electrical product, and more particularly to a meter that allows for easy and efficient detection of power consumption of an electrical product to be detected by simply connecting a power cable of the electrical product and a power cord from a power source to the meter and switching on the electrical product.

(b) DESCRIPTION OF THE PRIOR ART

The modern lives are full of electrical appliances, such as refrigerators, television sets, air conditioners, washing machines, microwave ovens, electromagnetic ovens, and desktop computers. Modern people are used to plugging the electrical appliances to wall sockets to enjoy the convenience provided by the electrical appliances.

People are generally of no serious concern about how much electrical current flowing through the electrical appliances when the electrical appliances are in operation. It is known that the current consumed in the operation of an electrical product multiplied by the voltage supplied by the wall socket equals to the power consumed, namely current (A)×voltage (V)=power (W). The power consumed is proportional to the electrical fair paid to the power companies.

People do not care about the importance of the current consumption of an electrical appliance. Although a specification booklet of the electrical appliance may shows the value of the current that might be consumed by the electrical appliance, most people simply puts aside the booklet when they just purchased the electrical product. Thus, most people are not aware of the current consumption of the electrical appliance that they are using, unless proper meters are employed to measure the consumption. In normal operation of an electrical appliance, the power consumption or wattage generally maintains constant. In case of abnormal current consumption, it may be easily identified that the electrical appliance is not in a normal condition and servicing might be needed to ensure operation safety.

Further, for a larger current, the cable through which the current flows must be made thicker. The metallic conductor that constitutes a cable is often copper based alloy, which offers excellent conductivity. However, no matter how excellent the electrical conductivity may be, there is always electrical resistance. According to Ohm's law, $I^2/R=W$, where I (ampere) indicates the consumption of current flowing through a cable, R (ohm) is resistance of the cable, and W (watt) is the power consumption that generates heat. The cable is covered with an outer insulation sheath. When I increases, W increases too and with the lapse of time, the temperature of the conductor gets higher and higher. This temperature cannot be easily dissipated due to being enclosed inside the outer insulation sheath. Although a minor portion of the heat might get away from the atmosphere by transmitting through the insulation, yet most of the heat is confined in the insulation, eventually leading to damage of the insulation. A visually perceivable situation is deformation and distortion of the insulation due to over heating, and may even be broken to expose the conductor.

Thus, it is necessary to do certain inspection of the consumption of current and power by an electrical appliance 20 after a long term operation of the electrical appliance or when abnormality of operation is perceived. Measurement of current that is being consumed by an electrical appliance currently can only be carried out in the manner demonstrated in FIG. 6, wherein a cable L of an electrical appliance 20 to be detected is cut off and a pair of probe terminals S1, S2 of a clamp meter S are respectively connected to the separated ends L1, L2 of the cut cable L to measure the current flowing therethrough and thus determine if the electrical appliance 20 is operating normally. However, after the measurement, there is no way to restore the integrity of the cut cable and the two separated ends of the cut cable L can only be re-connected by inter-entangling and wrapping each other. This inter-entangled connection may cause certain safety concerns, such as the inter-entangled ends being easily separated again, making a poor contact between the ends of the cable, or even leading to electrical shocking.

With the time of use of an electrical appliance, parts/components of the electrical appliance may get aged, susceptible to damage caused by deposition of dust, impact caused by falling, surrounding humidity, or other situation of over-loading, leading to operation failure. In this situation, the electrical appliance must be serviced or it is disposed of. However, for a situation where the electrical appliance is still in operation, but in an abnormal condition, unless inspection has been properly conducted, there is no way to prevent occurrence of severe damage, such as explosion of the electrical appliance, or even leading to fires when the insulation is damaged and causes short-circuiting.

The present invention aims to provide a clamp meter for measuring consumption of current and power of an electrical product in an easy and efficient way in order to eliminate the above discussed problems and drawbacks.

SUMMARY OF THE INVENTION

An objective of the present invention is to provide a clamp meter for measuring consumption of current and power of an electrical appliance. The clamp meter comprises a power inlet port and a power outlet port that are in controlled connection with each other. A current detection element is arranged between the power inlet port and the power outlet port. When the power inlet port is connected to a power source and the power outlet port is connected to an electrical appliance to be detected, with the electrical appliance turned on, the current detection element detects and converts the current flowing through the power outlet port into a digital signal, which is displayed on a display device mounted on the clamp meter, whereby, through the data and information displayed on the display device, a user may get aware of the power consumption of the electrical appliance and abnormality of power consumption thereof.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
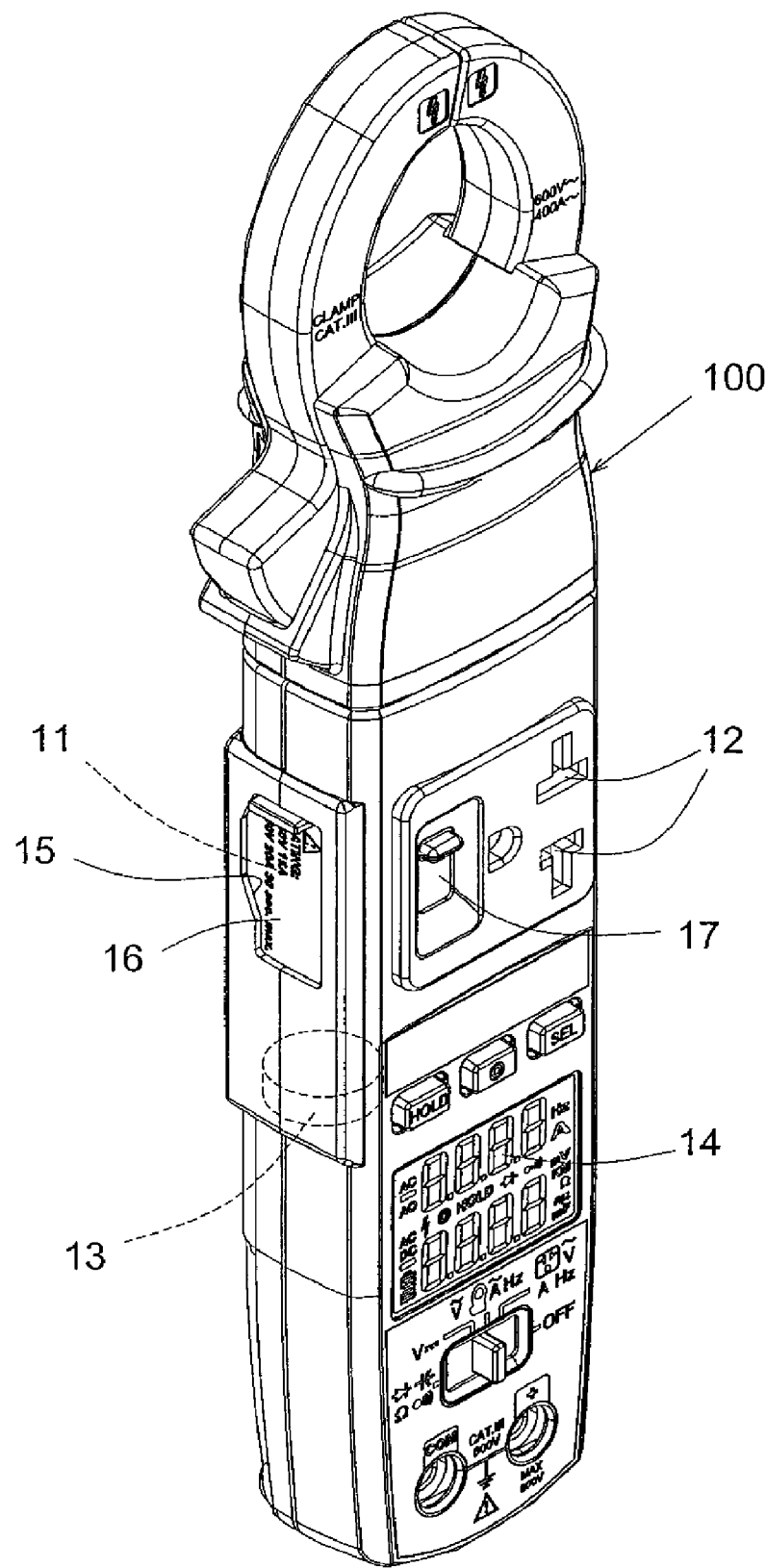
FIG. 1 is a perspective view of a clamp meter constructed in accordance with the present invention.

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

As shown in FIGS. 1-5, the present invention provides a clamp meter, generally designated at 100, for measuring consumption of current and power of an electrical product. The clamp meter 100 is provided with a power inlet port 11 comprising conductive terminals and a power outlet port 12 comprising conductive terminals, which are in controlled connection with each other. A current detection element 13 is arranged between the power inlet port 11 and the power outlet port 12. The clamp meter 100 is further provided with a display device 14. When the power inlet port 11 is connected to a power source and the power outlet port 12 is connected to an electrical appliance 20 to be detected, with the electrical appliance 20 turned on, the current detection element 13 detects the current flowing through the power outlet port 12 and converts the detected analog signal of current into a digital signal, which is displayed on the display device 14 of the clamp meter 100, whereby, through the data and information displayed on the display device 14, a user may get aware of the power consumption of the electrical appliance 20 and abnormality of power consumption thereof.

The display device 14 that is mounted to the clamp meter 100 may be a seven-segment display or a liquid crystal display. The present invention does not limit the display device 14 of the clamp meter 100 to any specific type.

Figure 2:
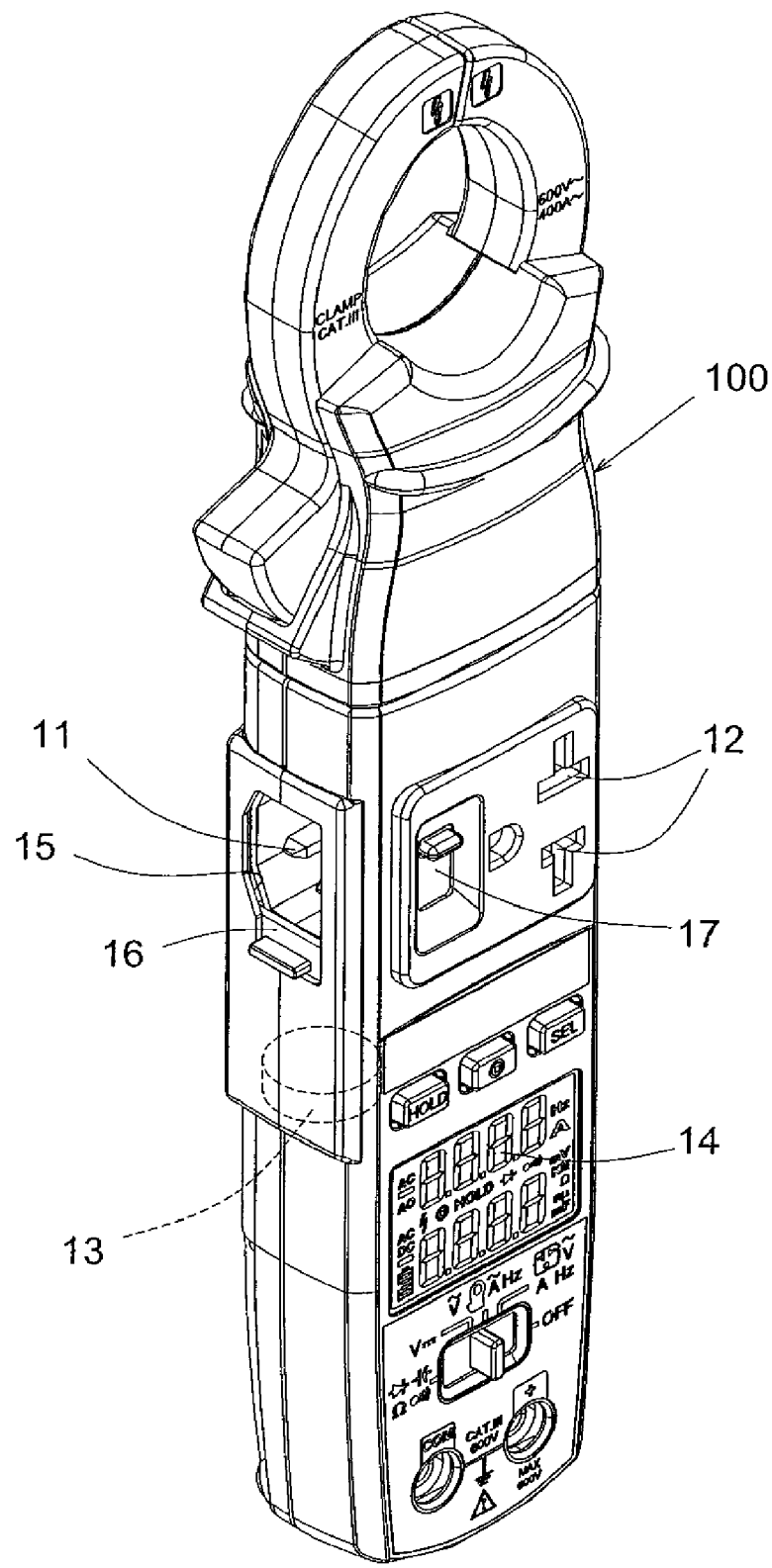
FIG. 2 is also a perspective view of the clamp meter of the present invention with a gate board sliding downward to show a power inlet port.
Figure 3:
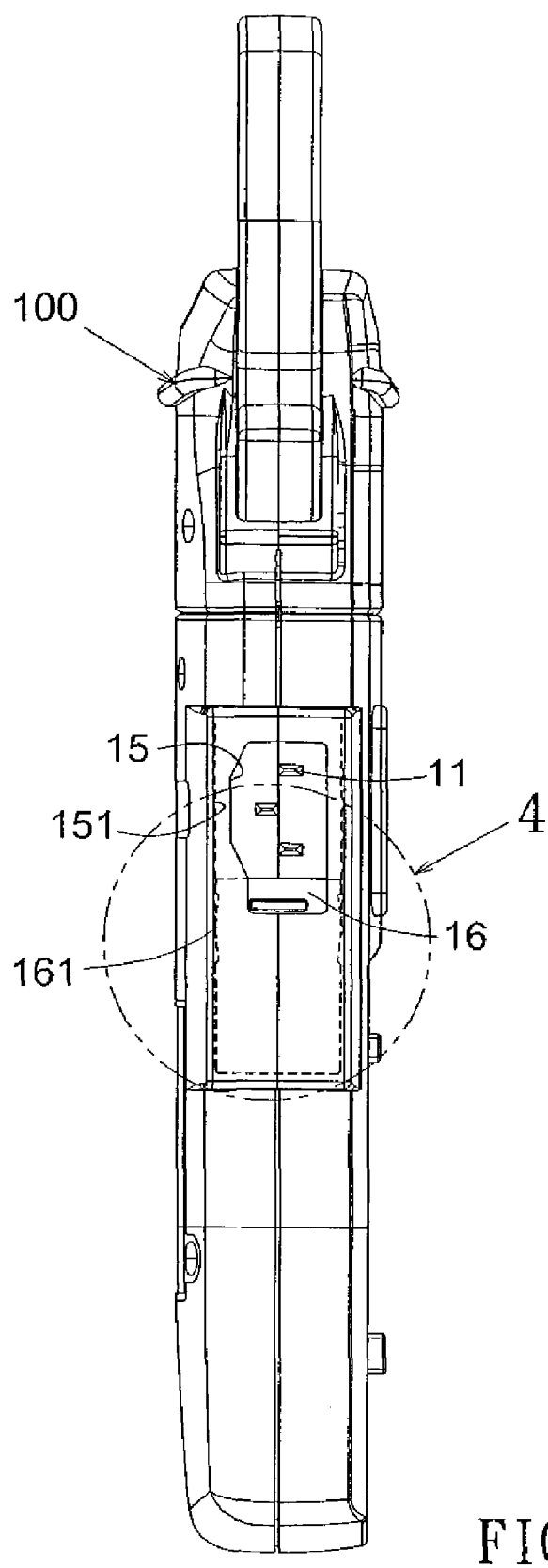
FIG. 3 is a side elevational view of the clamp meter of the present invention.
Figure 4:
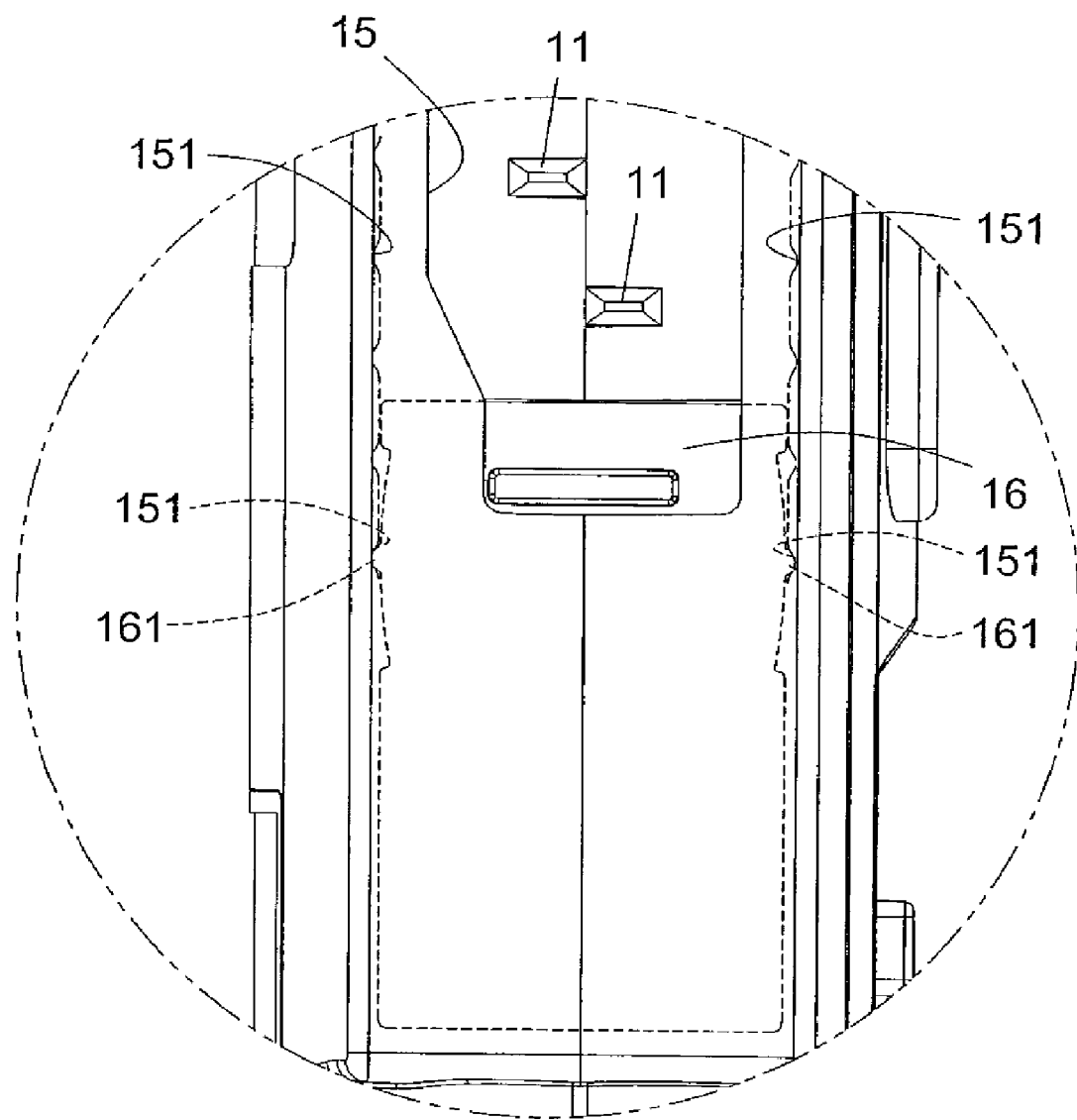
FIG. 4 is an enlarged view of an encircled portion 4 of FIG. 3.

As shown in FIGS. 2-4, the clamp meter 100 in accordance with the present invention is further provided with a slide groove 15 outside the power inlet port 11 to slidably receive and guide a gate board 16 therein. Edges of the gate board 16 that engage opposite side walls of the slide groove 15 form a plurality of positioning projections 161 with predetermined spacing therebetween (or at least one projection 161) for selectively and sequentially engaging and thus being positioned by a plurality of notches 151 defined in the corresponding side wall of the slide groove 15, so as to selectively set the position of the gate board 16 with respect to the slide groove 15. When the gate board 16 is moved to a topmost position, the gate board 16 completely shields the power inlet port 11; when the gate board 16 is moved downward to the bottommost position, the power inlet port 11 is completely open.

The clamp meter 100 in accordance with the present invention further comprises a switch 17 set between the power inlet port 11 and the power outlet port 12 for user selection of connection/disconnection between the power inlet port 11 and the power outlet port 12.

Figure 5:
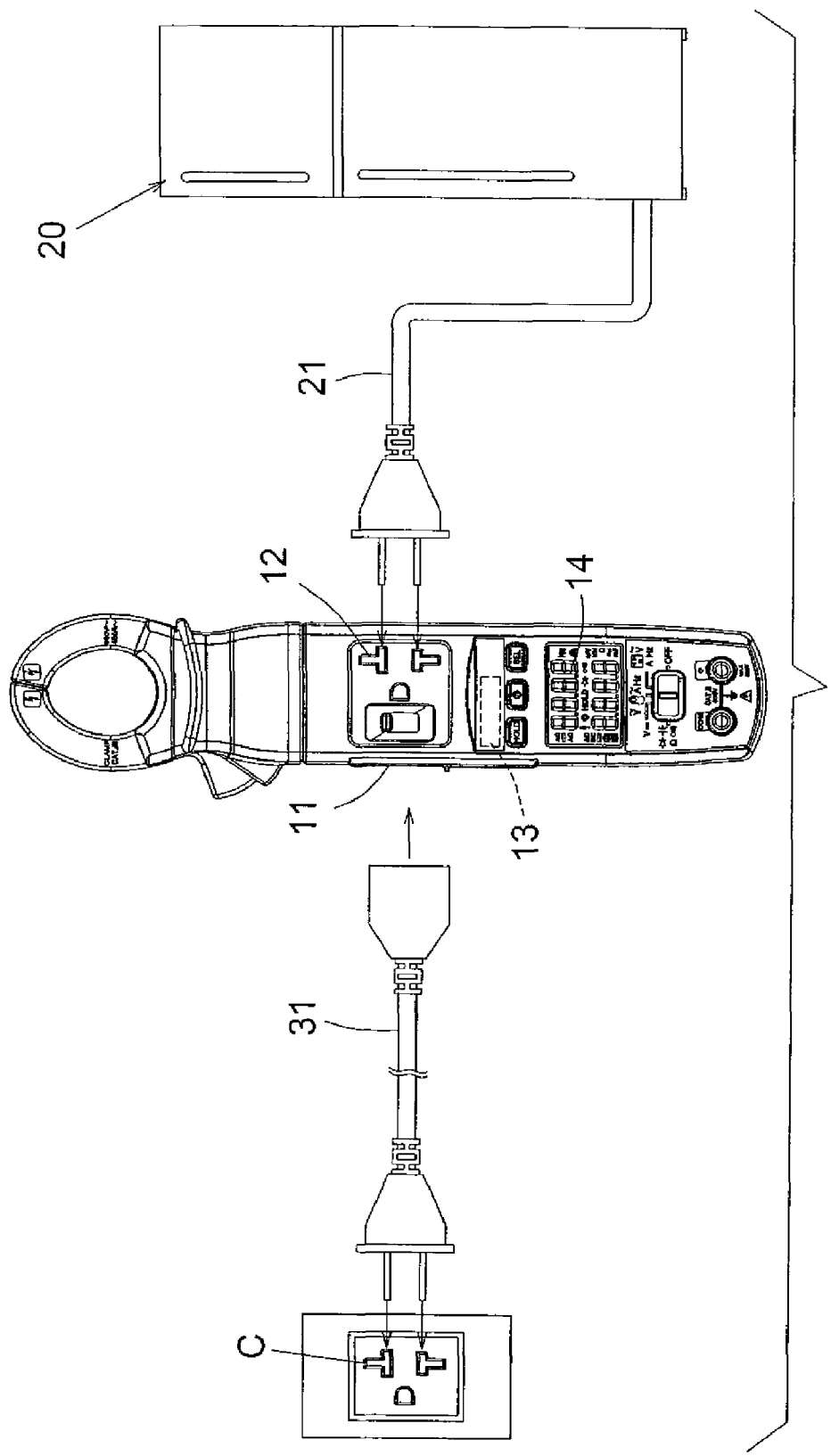
FIG. 5 is a schematic view showing an application of the clamp meter of the present invention.
Figure 6:
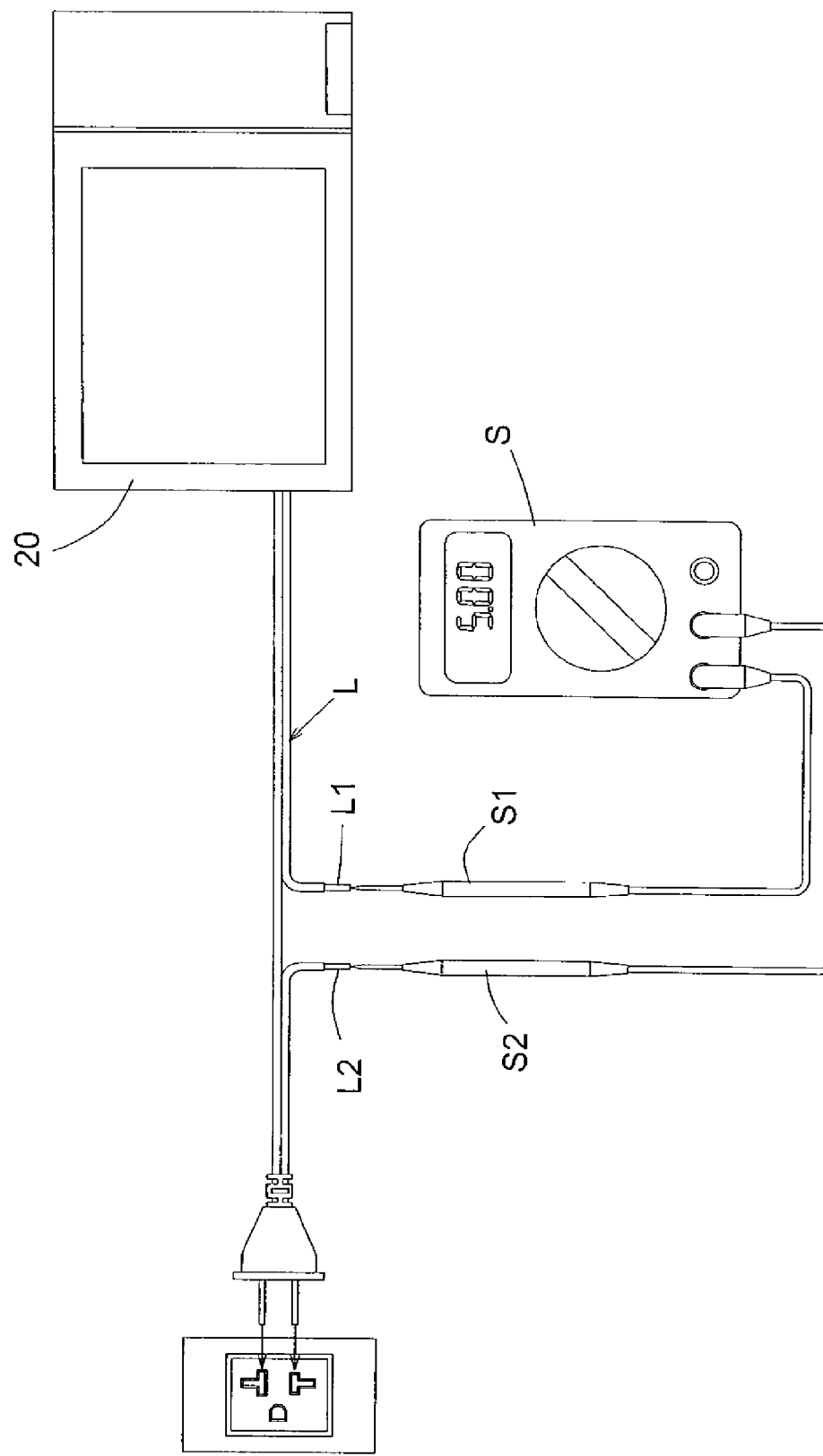
FIG. 6 is a schematic view showing a conventional multimeter in operation for detecting power consumption.

As shown in FIG. 5, to operate the clamp meter 100 in accordance with the present invention, a user connects opposite ends of a power cable 31 to the power inlet port 11 and a power source socket C, such as a power circuit of an electric main, a wall socket, and a direct-current power supply, and further connects a power cable 21 of an electrical appliance 20 to be detected to the power outlet port 12. When the electrical appliance 20 to be detected is turned on, the current detection element 13 may detect the current flowing through the power inlet port 11 and coverts the detection of current into a digital signal, which is then displayed on the display device 14 of the clamp meter 100, whereby the user may get aware of the power consumption of the electrical appliance 20 and abnormality of power consumption thereof through the data and information displayed on the display device 14, so as to identify whether the electrical appliance detected is in normal operation or not.

It is often that a wall socket is provided on a panel thereof with power specification, such as 15 A/125V or 20 A/250V. With the above discussed connection of an electrical appliance, the meter of the present invention, and the wall socket, the display device 14 may provide data and information to allow a user to identify whether the wall socket C is in an overloaded condition.

Besides the above discussion function of detection and inspection, the clamp meter 100 in accordance with the present invention may also be applied to realize long term monitoring of variation of power consumption of a specific electrical appliance 20 by connecting the electrical appliance 20 to the power outlet port 12 of the clamp meter 100 and connecting the power inlet port 11 of the clamp meter 100 to a power source.

The clamp meter 100 in accordance with the present invention can carry out detection and inspection of the power consumption of an electrical appliance without breaking or cutting off a power cable of the electrical appliance. Thus, the detection and inspection can be carried out in a more efficient manner and is also safer.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A clamp meter adapted for measuring consumption of current and power of an electrical appliance, the clamp meter comprising a power inlet port and a power outlet port and a current detection element arranged between the power inlet port and the power outlet port, a display device mounted on the clamp meter, the power inlet port being adapted to connected to a power source and the power outlet port being adapted to connect to the electrical appliance, whereby when the electrical appliance is turned on, the current detection element detects and converts current flowing through the power outlet port into a digital signal, which is displayed on the displayed device, wherein the clamp meter forms a slide groove outside the power inlet port to slidably receive a gate board, the gate board having edges forming at least one positioning projection, which selectively and sequentially engages a plurality of notches defined in side walls of the slide groove, so as to selectively position the gate board with respect to the slide groove.

2. The clamp meter according to claim 1, wherein the clamp meter forms a switch between the power inlet port and the power outlet port for selective connection/disconnection between the power inlet port and the power outlet port.

* * * * *